(12) United States Patent
Maetani et al.

(10) Patent No.: US 6,210,548 B1
(45) Date of Patent: Apr. 3, 2001

(54) APPARATUS FOR PARTIALLY REMOVING PLATING FILMS OF LEADFRAME

(75) Inventors: Kazuo Maetani, Oume; Takashi Kobayashi, Kiyose; Keisuke Wada, Oume, all of (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 0 days.

(21) Appl. No.: 09/276,409

(22) Filed: Mar. 25, 1999

(30) Foreign Application Priority Data

Mar. 26, 1998 (JP) .................................................. 10-079841

(51) Int. Cl.[7] .................................................. C25F 7/00
(52) U.S. Cl. .................................... 204/224 M; 204/275.1
(58) Field of Search ........................... 204/224 M, 275.1; 205/667

(56) References Cited

U.S. PATENT DOCUMENTS

| | | | |
|---|---|---|---|
| 4,110,190 | * | 8/1978 | Visser .............................. 204/224 M |
| 4,202,739 | * | 5/1980 | Csakvary et al. ........... 204/224 M X |
| 4,545,885 | | 10/1985 | Hori et al. . |
| 5,284,554 | * | 2/1994 | Datta et al. ................ 204/224 M X |

FOREIGN PATENT DOCUMENTS

| | | |
|---|---|---|
| 60-079760 | 5/1985 | (JP) . |
| 61-183950 | 8/1986 | (JP) . |
| 1-260844 | 10/1989 | (JP) . |
| 6-146100 | 5/1994 | (JP) . |
| 11-124699 | 5/1999 | (JP) . |

\* cited by examiner

*Primary Examiner*—Donald R. Valentine
(74) *Attorney, Agent, or Firm*—Fish & Richardson P.C.

(57) ABSTRACT

An apparatus for partially removing plating films of a leadframe includes a mask member having annular openings configured to coincide with the predetermined areas of the leadframe for which plating films are not required; a mask supporting means having outflow channels to introduce a film removing liquid, film removing liquid outflow holes, film removing liquid inflow channels, and an insoluble cathode wire housing groove; a mechanism for supplying a power to continuously run an insoluble cathode wire; and a mechanism for masking and dismasking the upper surface of the leadframe placed at a predetermined position of the mask supporting member. In this way, the plating films deposited outside an area for which plating is necessary are easily removed and cost can be reduced.

2 Claims, 6 Drawing Sheets

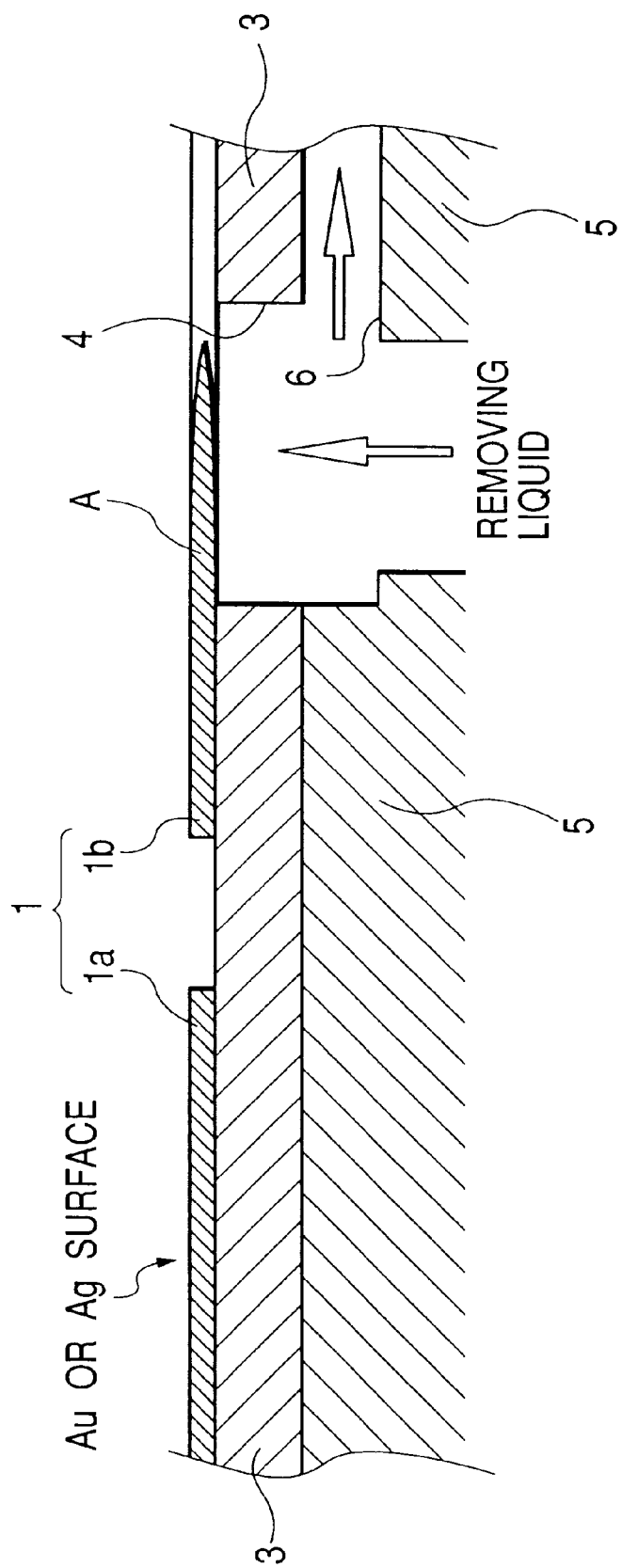

US 6,210,548 B1

APPARATUS FOR PARTIALLY REMOVING PLATING FILMS OF LEADFRAME

BACKGROUND OF THE INVENTION

1. Field of the Invention

This invention relates to an apparatus for removing Au or Ag plating films deposited on the surface of an area for which plating is not necessary, from a leadframe depositing the plating films.

2. Description of Related Art

As one of systems for mounting semiconductor chips on a leadframe, a so-called wire bonding system is known in which each of the semiconductor chips is bonded to each of the die pads of the leadframe and is connected by bonding wires with the tips of inner leads.

An example of the leadframe used in this system is shown in FIGS. 1A and 1B. In order to facilitate a bonding with the bonding wires and improve its reliability, a leadframe 1, as shown in FIG. 1A, has plating films 2 of precious metal, such as Au or Ag, deposited on the surfaces of parts (indicated by hatching), such as a die pad 1a and the tips of inner leads 1b, for which plating is necessary. If the deposition of the plating films is extended unnecessarily, a greater amount of precious metal, such as Au or Ag, than is necessary will be used, and thus cost is raised. Moreover, if the Au or Ag plating films protrude from a mold area (an area in which an IC is covered with resin), the effect of the hermetical seal of molding will be lost or molding resin will be peeled off. This causes various obstacles to a semiconductor mounting process. Consequently, all the products depositing the plating films outside areas for which plating is necessary are treated as rejects. In this way, when the plating films are deposited outside the areas for which plating is necessary, production efficiency is impaired. The positioning accuracy of the plating films is thus important in plating the leadframe.

In general, the plating films are deposited in such a way that, for example, a rubber pad is pressed against the surface of the area of the leadframe for which plating is not necessary and an Au or Ag plating liquid is sprayed on the leadframe. In this case, the plating liquid penetrates into clearance between the rubber pad and the leadframe, and films may be deposited by the plating liquid on the surface of the area for which plating is not necessary. The plating films deposited on the surface of this area are less in thickness than those deposited on the surface of an area for which plating is necessary.

Thus, as shown in FIG. 1B, when the Au or Ag plating films 2 are also deposited on the surface of an area A of the leadframe 1 for which plating is not necessary, an apparatus for removing films, such as that shown in FIG. 2, is used to eliminate unwanted plating films. Specifically, the leadframe 1 is passed between insoluble anode rollers R so as to function as anodes, and an insoluble cathode plate P is used for electrolysis through a film removing liquid L such as a cyanic solution.

This electrolytic treatment is carried out in accordance with the thicknesses of the plating films deposited on the surface of the area for which plating is not necessary, over the entire surface including the area for which plating, such as Au or Ag, is necessary, so that the plating films are dissolved and removed.

With such a technique of removing the plating films, however, the plating films in the area for which plating is necessary are removed by a predetermined thickness, and thus the thicknesses of the Au or Ag plating films themselves must be previously increased. Consequently, time required for plating is extended unnecessarily and production efficiency is impaired accordingly, with a resulting increase in cost.

Furthermore, the use of this technique shows a tendency that the plating films deposited inside the area for which plating is necessary are excessively removed or the plating films outside this area cannot be completely removed. In this way, it is very difficult and cumbersome to adjust only necessary plating films to desired thicknesses so that they are kept constant.

SUMMARY OF THE INVENTION

It is, therefore, an object of the present invention to provide an apparatus for partially removing plating films of a leadframe which is capable of easily removing the plating films deposited outside an area for which plating is necessary, without readjusting the thicknesses of plating films deposited inside this area, and is also capable of improving the entire work efficiency of plating treatment of the leadframe and of reducing cost.

In order to achieve this object, the apparatus for partially removing plating films of a leadframe according to the present invention includes a mask member having annular openings configured to coincide with the predetermined areas of the leadframe for which plating films are not required; a mask supporting means having outflow channels communicating with the annular openings to introduce a film removing liquid outside the annular openings, film removing liquid outflow holes communicating with the outflow channels to introduce the film removing liquid downwardly, film removing liquid inflow channels for feeding the film removing liquid to the annular openings, and an insoluble cathode wire housing groove for incorporating an insoluble cathode wire therein, communicating with the film removing liquid inflow channels; a mechanism for supplying a power to continuously run the insoluble cathode wire; and a mechanism for masking and dismasking the upper surface of the leadframe placed at a predetermined position of the mask supporting member.

More specifically, the apparatus of the present Invention Includes a mask member having annular openings configured to coincide with the predetermined areas of the leadframe for which plating films are not required; a mask supporting member provided with guide grooves communicating with the annular openings to introduce a film removing liquid outside the annular openings, first film removing liquid outflow holes communicating with both sides of each of the guide grooves to Introduce the film removing liquid downwardly, and a first opening communicating with the first film removing liquid outflow holes and with fine groves extending outside the first film removing liquid outflow holes and the guide grooves; a first lower member placed beneath the mask supporting member to configure the outflow channels of the film removing liquid on the upper surface thereof, in association with the fine grooves of the mask supporting member, having a wire housing groove for incorporating an insoluble cathode wire therein, communicating with the first opening of the mask supporting member, a first film removing liquid jet hole of slit shape, communicating with the wire housing groove, and second film removing liquid outflow holes communicating with the outflow channels of the film removing liquid, introducing the film removing liquid downwardly; a second lower member having a second opening communicating with the first film removing liquid Jet hole and third film removing liquid outflow holes communicating with the second film removing liquid outflow holes, introducing the film removing liquid downwardly; a third lower member having a third opening communicating with the second opening, second film removing liquid Jet holes staggered, communicating with the third opening, and fourth film removing liquid outflow holes communicating with the third film removing liquid outflow holes, introducing the film removing liquid downwardly; a mechanism for supplying a power to continuously run the insoluble cathode wire; and a mechanism for masking and dismasking the upper surface of the leadframe placed at a predetermined position of the mask supporting member, with a rubber part constructed to coincide with each of predetermined areas in which plating films are required, by actuating a cylinder vertically.

This and other objects as well as the features and advantages of the present invention will become apparent from the following detailed description of the preferred embodiment when taken in conjunction with the accompanying drawings.

BRIEF DESCRIPTION OF THE DRAWINGS

FIG. 6 is a partially enlarged sectional view taken along line V—V in FIG. 3.

DETAILED DESCRIPTION OF THE PREFERRED EMBODIMENT

The apparatus for partially removing plating films of a leadframe according to the present invention will be described below with reference to the drawings.

Figure 3:
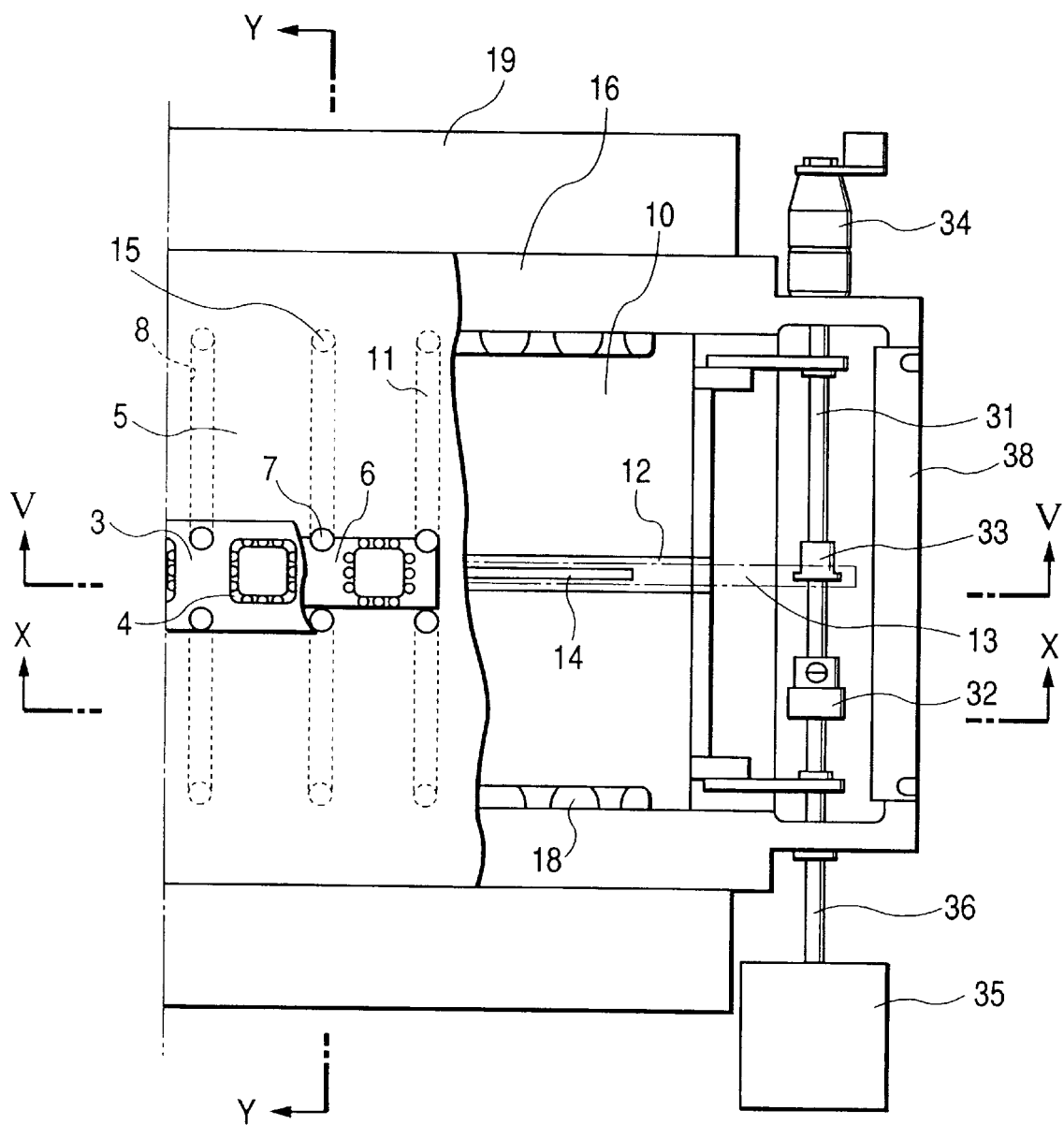
FIG. 3 is a plan view showing an apparatus for partially removing plating films, according to the present invention.

In FIGS. 3 to 6, a mask member 3 is constructed with a resilient member such as a rubber pad. The mask member 3 is provided with annular openings 4, each for supplying a film removing liquid, such as a cyanic solution, to a predetermined position of a leadframe 1 where plating films are not necessary, that is, an area from which unwanted plating films must be removed. The mask member 3 is also placed to come in close contact with the lower surface of the leadframe 1. In FIG. 3, the film removing liquid is supplied through each annular opening 4 so that the unwanted plating films are removed.

Figure 4:
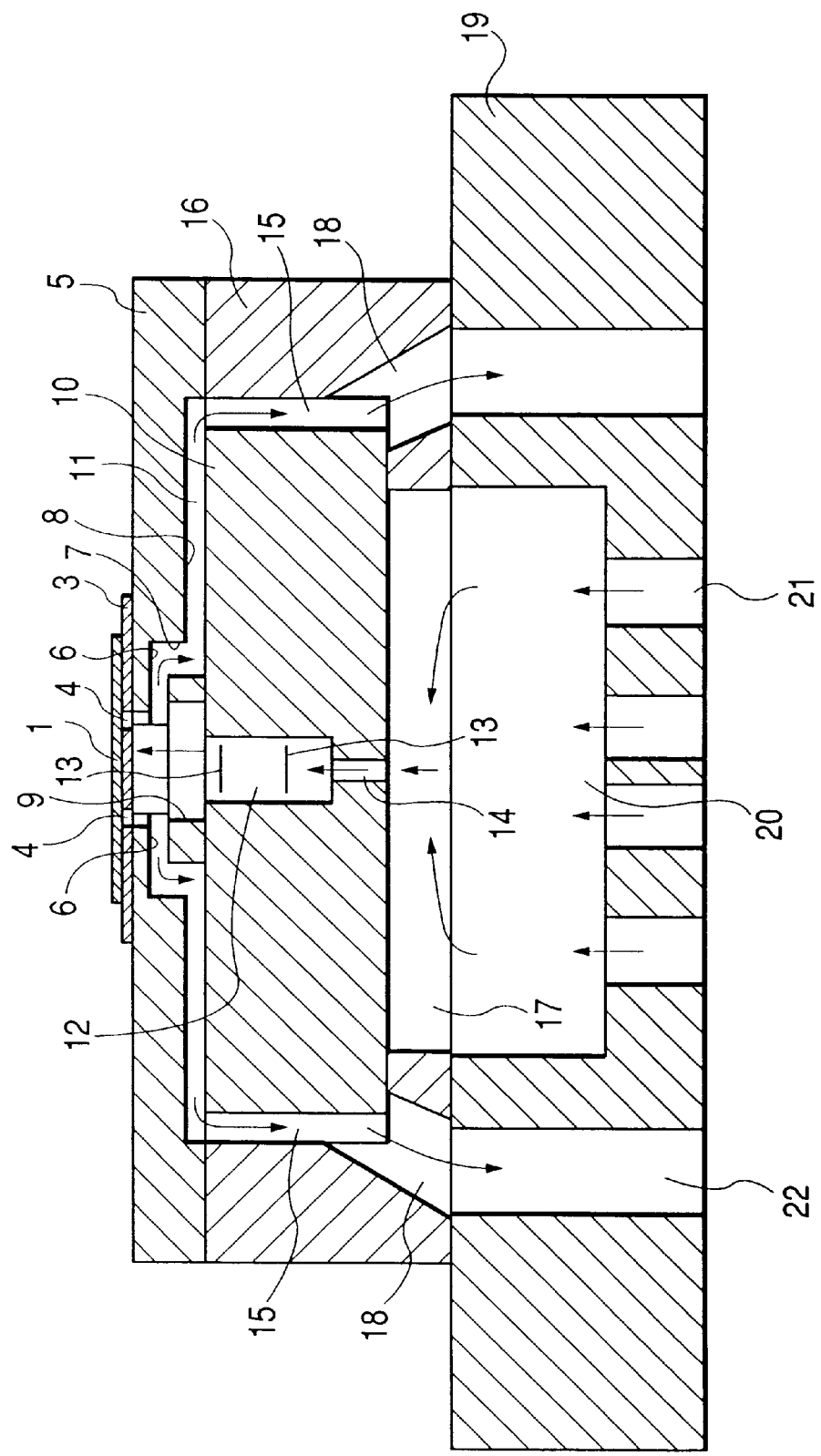
FIG. 4 is a sectional view, taken along line Y—Y in FIG. 3, showing essential parts of the apparatus.

As shown in FIGS. 3 and 4, a mask supporting member 5 is placed beneath the mask member 3. The mask supporting member 5 is provided with guide grooves 6 for introducing the film removing liquid outside the annular opening 4, and the guide grooves 6 communicate with the annular opening 4. First film removing liquid outflow holes 7 for introducing the film removing liquid downwardly are provided on both side and communicate with the guide grooves 6. The mask supporting member 5 is also provided with a first opening 9 communicating with the guide grooves 6 on the lower side thereof.

A first lower member 10 is placed beneath the mask supporting member 5. The first lower member 10 is designed to construct outflow channels 11 for the film removing liquid, on the upper side thereof, in association with fine grooves 8 of the mask supporting member 5. In addition, the first lower member 10 has a wire housing groove 12 communicating with the first opening 9 of the mask supporting member 5. The wire housing groove 12 is adapted to incorporate an insoluble cathode wire 13 for the ion exchange of Au or Ag plating films deposited outside the area for which plating is necessary. The first lower member 10 is also designed so that a first film removing liquid jet hole 14 of slit shape for feeding the film removing liquid communicates with the wire housing groove 12. Moreover, the first lower member 10 is provided with second film removing liquid outflow holes 15 communicating with the outflow channels 11 for the removing liquid, so that the second film removing liquid outflow holes 15 introduce the film removing liquid downwardly.

A second lower member 16 has a second opening 17 for feeding the film removing liquid to the first film removing liquid Jet hole 14. The second lower member 16 also has third film removing liquid outflow holes 18 communicating with the second film removing liquid outflow holes 15, so that the third film removing liquid outflow holes 18 introduce the film removing liquid downwardly.

Figure 5:
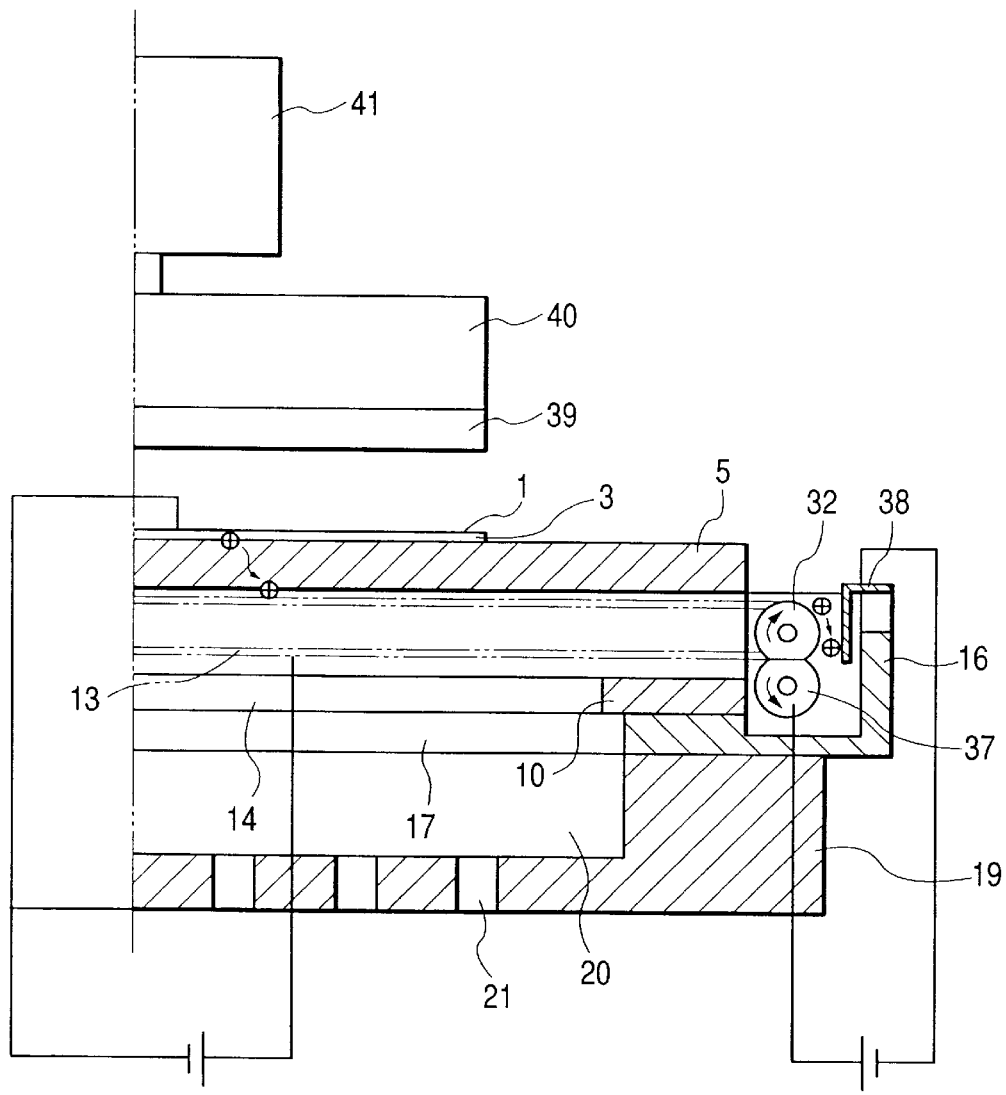
FIG. 5 is a sectional view taken along line X—X in FIG. 3.

A mechanism for supplying a power to continuously run the insoluble cathode wire 13 is provided to extend from the first lower member 10 to the second lower member 16. What follows is a description of this mechanism. As illustrated in FIG. 3, a shaft for running the insoluble cathode wire 13, a spur gear 32, and a sprocket wheel 33 are connected to the first lower member 10. The insoluble cathode wire 13 is a ring-shaped, endless wire (not shown), which is designed so that the teeth (not shown) of the sprocket wheel 33 engage with the ring of the wire. In order to supply the insoluble cathode wire 13 with the power and torque, a rotary connector 34, a motor 35, and a shaft 36 are connected to the second lower member 16. As shown in FIG. 5, a spur gear 37 and an insoluble cathode plate 38 for torque transmission from the motor 35 and electric conduction, respectively, are also connected to the second lower member 16.

A third lower member 19 is provided with a third opening 20 communicating with the second opening 17. The third lower member 19 is constructed so that second film removing liquid jet holes 21 staggered for feeding the film removing liquid to the third opening 20 communicate with the third opening 20. The third lower member 19 is also provided with fourth film removing liquid outflow holes 22 communicating with the third film removing liquid outflow holes 18, so that the fourth film removing liquid outflow holes 22 introduce the film removing liquid downwardly.

Furthermore, the apparatus of the present invention is equipped with a mechanism for masking and dismasking the upper surface of the leadframe 1. A member for masking the leadframe 1, as shown in FIG. 5, are constructed with a rubber part 39 and a supporting plate 40 for holding the rubber part 39. The rubber part 39 and the supporting plate 40 are shaped to coincide with a predetermined area of the leadframe 1 in order to cover the Au or Ag plating films in the area for which plating is necessary, together with the mask member 3 having each annular opening 4. A cylinder 41 is connected to the rubber part 39 and the supporting plate 40, which are raised and lowered by actuating the cylinder 41.

Subsequently, a description will be given of plating removal treatment using the apparatus for partially removing plating films of a leadframe according to the present invention, constructed as mentioned above.

The leadframe 1 is fed to the apparatus so that the plating films of the leadframe 1 deposited in the area for which plating is not necessary are located on each annular opening 4 of the mask member 3 by operating a feed means not shown. Subsequently, the rod of the cylinder 41 is lowered. The rubber part 39 connected to the cylinder 41 is associated with the mask member 3 having the annular opening 4 to sandwich the leadframe 1 therebetween. In this way, the Au or Ag plating films in the area for which plating is necessary are protected.

Then, as depicted in FIG. 6, the film removing liquid flowing uniformly through the film removing liquid jet holes is supplied to the Au or Ag plating films unnecessarily deposited in the area A for which plating is not required. The film removing liquid is jetted toward the area from which the unwanted plating films of the leadframe 1 must be removed, passing through the second film removing liquid jet holes 21 of the third lower member 19, the third opening 20, the second opening 17 of the second lower member 16, the first film removing liquid jet hole 14 of the first lower member 10, the wire housing groove 12, the first opening 9 of the mask supporting member 5, the guide grooves 6, and the annular opening 4 of the mask member 3. The unwanted plating films of the leadframe 1 are thus removed.

In this case, the power is supplied to the insoluble cathode wire 13 and the leadframe 1, and the Au or Ag metal removed by electrolysis through the film removing liquid is electrodeposited on the insoluble cathode wire 13. The torque of the motor 35 is transmitted to the insoluble cathode wire 13 through the shaft 36, the spur gear 32 and the sprocket wheel 33 to run the insoluble cathode wire 13 which is endless.

During the run of the insoluble cathode wire 13, the power is supplied to the insoluble cathode wire 13 and the insoluble cathode plate 38. The Au or Ag metal electrodeposited on the insoluble cathode wire 13 is then electrodeposited on the insoluble cathode plate 38, with the insoluble cathode wire 13 as an anode and the insoluble cathode plate 38 as a cathode. The insoluble cathode plate 38 is replaced when necessary.

In doing so, the insoluble cathode plate 38 is dismounted and thereby the unwanted plating films deposited outside the area for which plating is necessary can be easily excluded. Where the area of the leadframe 1 for which plating is required is changed, the shape of the mask member 3 having the annular openings 4 is modified and thereby the area from which the unwanted plating films must be removed can be easily changed.

The film removing liquid having been jetted toward the leadframe 1 flows through the guide grooves 6, the first film removing liquid outflow holes 7, and the outflow channels 11 of the mask supporting member 5; the second film removing liquid outflow holes 15 of the first lower member 10; and the third film removing liquid outflow holes 18 of the second lower member 16, to the fourth film removing liquid outflow holes 22 of the third lower member 19. The film removing liquid passing through the fourth film removing liquid outflow holes 22 is finally returned to a film removing liquid service tank, not shown. After the unwanted plating films have been removed, the rod of the cylinder 41 is raised so that the leadframe 1 is taken out of the apparatus.

According to the present invention, the apparatus is designed to jet the film removing liquid through the annular openings 4, and thus the film removing liquid can be jetted toward a desired area, not over the entire surface of the leadframe. Moreover, since the film removing liquid, when jetted, is passed through pluralities of jet holes and openings, it is easy to made a fine adjustment of the velocity and the amount of liquid to be jetted. Consequently, only the unwanted plating films can be positively removed, without affecting the necessary plating films.

Embodiment

The present invention will be further explained with reference to the embodiment. The apparatus constructed as shown in FIGS. 3 to 6 is used to remove plating films deposited in the areas of unwanted plating of a predetermined number of leadframes under the following conditions.

Conditions

Composition of film removing liquid:
Commercial film removing liquid 500 ml/l+KOH 20 g/l Temperature of film removing liquid: 45° C.

Electrolytic current density: 45A/d

Observations of the leadframes, after the operation of removing the plating films has been over, show that only the plating films in the area of unwanted plating have been completely removed in any leadframe. Also, the average plating thicknesses of the die pads measure 5–7 $\mu$m, and variations in plating thickness are ±2 $\mu$m.

Conventional Example

Figure 1B:
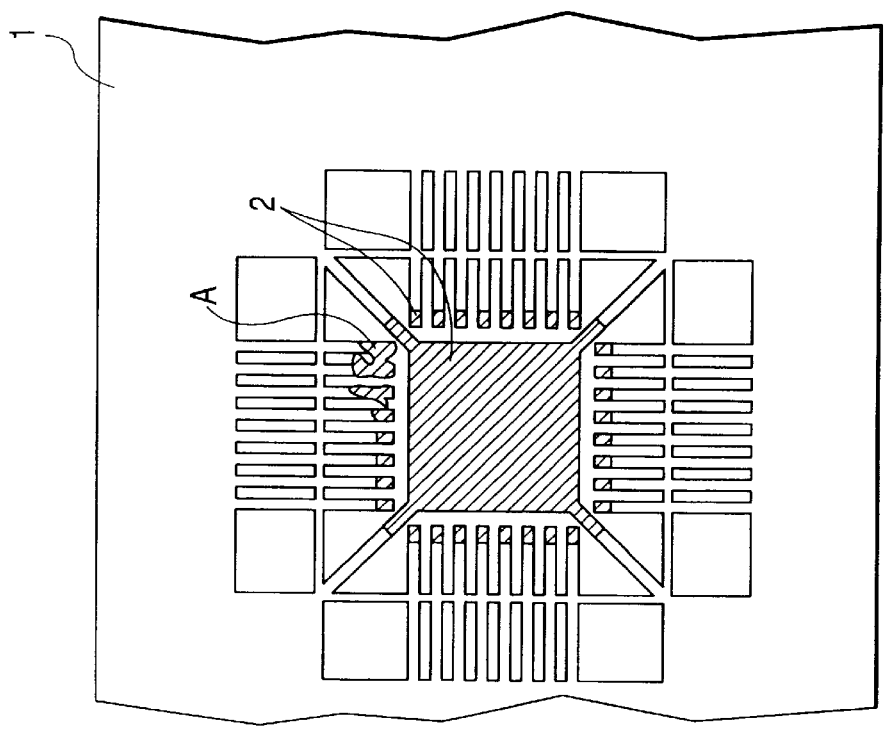
FIGS. 1A and 1B are plan views showing states of deposition of plating on a leadframe.
Figure 1A:
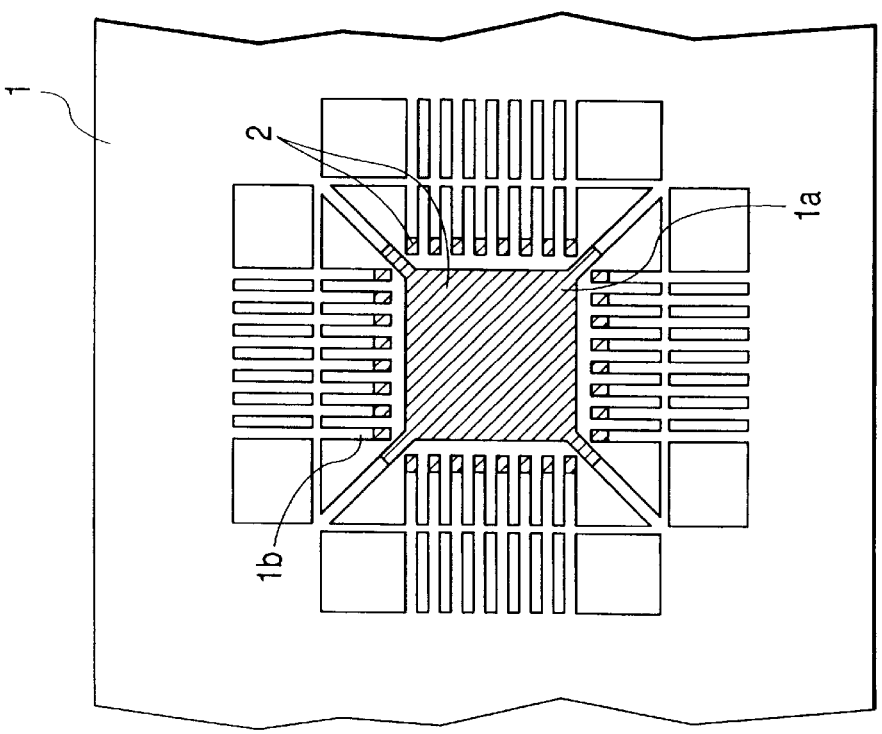
Figure 2:
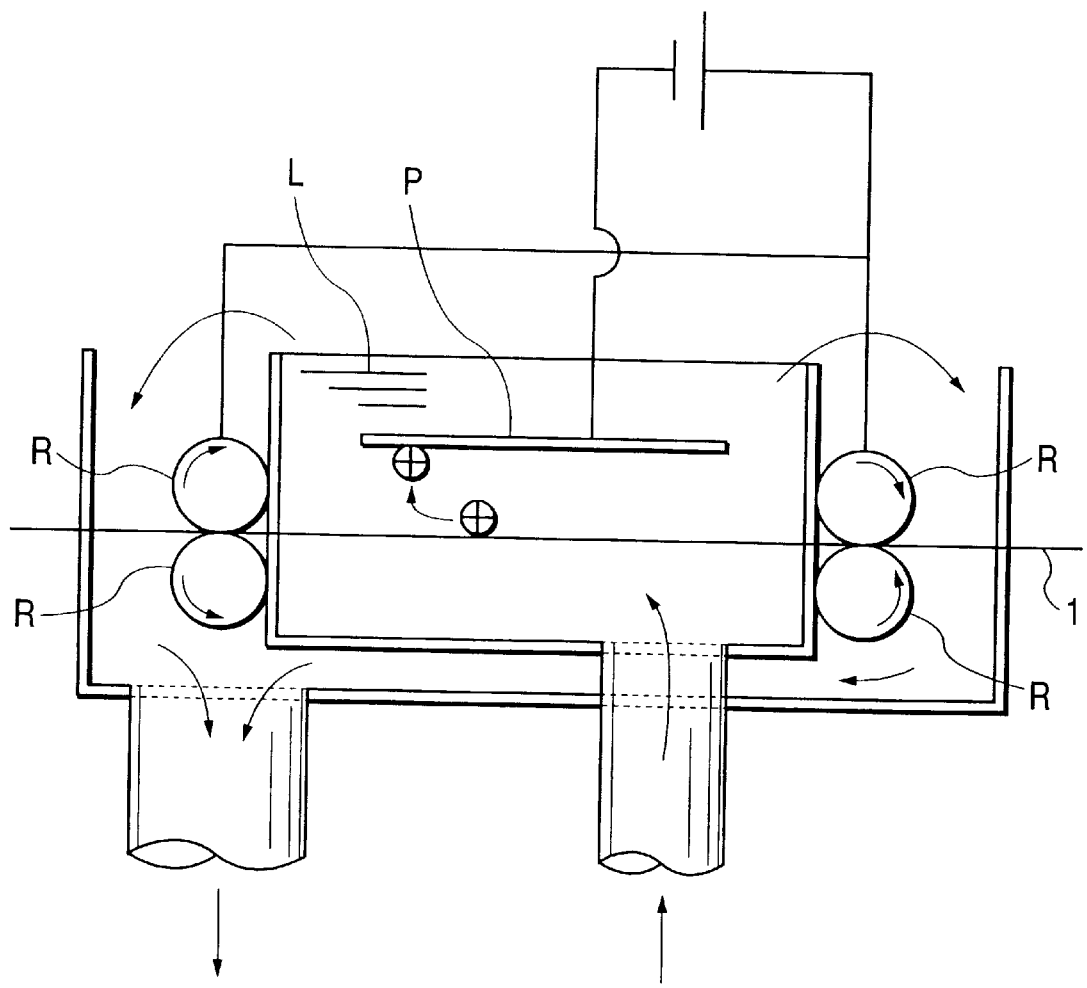
FIG. 2 is a conceptual view showing a conventional apparatus for removing plating films.

The apparatus constructed as shown in FIG. 2 is used to remove the unwanted plating films under the same conditions as in the embodiment. Observations of the leadframes, after the operation of removing the plating films has been over, show that only the plating films in the area of unwanted plating have been incompletely removed. Also, the average plating thicknesses of the die pads measure 3–6 $\mu$m, and variations in plating thickness are ±3 $\mu$m.

What is claimed is:

1. An apparatus for removing plating films of a leadframe, comprising:

a mask member having annular openings configured to substantially correspond with predetermined areas of said leadframe;

a mask supporting means including:
a plurality of outflow channels coupled with said annular openings, said plurality of outflow channels configured to introduce a film removing liquid,
at least one film removing liquid outflow hole coupled to said plurality of outflow channels to direct said film removing liquid downwardly,
a plurality of inflow channels for feeding said film removing liquid to said annular openings, and
a housing groove for incorporating an insoluble cathode wire therein, said housing groove coupled to said plurality of inflow channels;

a mechanism for supplying a power to said insoluble cathode wire; and a mechanism for masking and unmasking an upper surface of said leadframe.

2. An apparatus for removing plating films of a leadframe, comprising:

a mask member having annular openings configured to substantially correspond with predetermined areas of said leadframe;

a mask supporting member including:
a plurality of guide grooves coupled with said annular openings, said plurality of guide grooves configured to introduce a film removing liquid, a first set of outflow holes coupled to both sides of each of said plurality of guide grooves to direct said film removing liquid downwardly, and a first opening couple to said first set of outflow holes and to fine grooves extending outside said first set of outflow holes and said plurality of guide grooves;

a first lower member disposed beneath said mask supporting member, said first lower member configured to form said first set of outflow holes on an upper surface thereof, in association with said fine grooves of said mask supporting member, said first lower member having a wire housing groove for incorporating an insoluble cathode wire therein, and coupled to said first opening of said mask supporting member, such that said first lower member includes:

a first film removing liquid jet hole of slit shape, coupled to said wire housing groove, and a second set of outflow holes coupled to said first set of outflow holes, and configured to introduce said film removing liquid downwardly;

a second lower member having a second opening coupled to said first film removing liquid jet hole, such that said second lower member includes a third set of outflow holes coupled to said second set of outflow holes, to introduce said film removing liquid downwardly;

a third lower member including:
  a third opening coupled to said second opening,
  a second set of film removing jet holes staggered, and coupled to said third opening, and
  a fourth set of outflow holes coupled to said third set of outflow holes,
  where said openings and holes introduce the film removing liquid downwardly;

a mechanism for supplying a power to said insoluble cathode wire; and a mechanism for masking and unmasking an upper surface of said leadframe, such that a rubber part is formed to substantially correspond to each of predetermined areas by actuating a cylinder.

* * * * *